US010301176B2

(12) United States Patent
Ofner et al.

(10) Patent No.: US 10,301,176 B2
(45) Date of Patent: *May 28, 2019

(54) MICROELECTROMECHANICAL SYSTEM (MEMS) ON APPLICATION SPECIFIC INTEGRATED CIRCUIT (ASIC)

(71) Applicant: Intel IP Corporation, Santa Clara, CA (US)

(72) Inventors: Gerald Ofner, Regensburg (DE); Thorsten Meyer, Regensburg (DE); Reinhard Mahnkopf, Oberhaching (DE); Christian Geissler, Teugn (DE); Andreas Augustin, Munich (DE)

(73) Assignee: Intel IP Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/857,461

(22) Filed: Dec. 28, 2017

(65) Prior Publication Data

US 2018/0186627 A1 Jul. 5, 2018

Related U.S. Application Data

(60) Continuation of application No. 15/484,765, filed on Apr. 11, 2017, which is a division of application No. (Continued)

(51) Int. Cl.
*B81B 7/00* (2006.01)
*B81C 1/00* (2006.01)

(52) U.S. Cl.
CPC .......... *B81C 1/00238* (2013.01); *B81B 7/008* (2013.01); *B81C 1/0023* (2013.01);
(Continued)

(58) Field of Classification Search
CPC ....... H01L 2924/014; H01L 2924/1461; H01L 2224/131
See application file for complete search history.

(56) References Cited

U.S. PATENT DOCUMENTS

2005/0189635 A1  9/2005  Humpston et al.
2006/0034472 A1  2/2006  Bazarjani et al.
(Continued)

FOREIGN PATENT DOCUMENTS

CN  202508874 U  10/2012
DE  7708045 U1  7/1977
(Continued)

OTHER PUBLICATIONS

International Search Report and Written Opinion for PCT/US2013/048552, dated Mar. 31, 2014, 13 pages.
(Continued)

*Primary Examiner* — Elias Ullah
(74) *Attorney, Agent, or Firm* — Schwabe, Williamson & Wyatt, P.C.

(57) ABSTRACT

In embodiments, a package assembly may include an application-specific integrated circuit (ASIC) and a microelectromechanical system (MEMS) having an active side and an inactive side. In embodiments, the MEMS may be coupled directly to the ASIC by way of one or more interconnects. The MEMS, ASIC, and one or more interconnects may define or form a cavity such that the active portion of the MEMS is within the cavity. In some embodiments, the package assembly may include a plurality of MEMS coupled directly to the ASIC by way of a plurality of one or more interconnects. Other embodiments may be described and/or claimed.

29 Claims, 11 Drawing Sheets

Related U.S. Application Data

14/403,571, filed as application No. PCT/US2013/048552 on Jun. 28, 2013, now Pat. No. 9,663,353.

(52) U.S. Cl.
CPC . *B81B 2201/025* (2013.01); *B81B 2201/0235* (2013.01); *B81B 2201/0242* (2013.01); *B81B 2201/0257* (2013.01); *B81B 2201/0264* (2013.01); *B81B 2201/0271* (2013.01); *B81B 2201/10* (2013.01); *B81B 2207/012* (2013.01); *B81B 2207/053* (2013.01); *B81B 2207/07* (2013.01); *B81B 2207/096* (2013.01); *B81C 2203/0792* (2013.01); *H01L 2224/16225* (2013.01); *H01L 2224/48091* (2013.01); *H01L 2924/15311* (2013.01)

(56) References Cited

U.S. PATENT DOCUMENTS

| | | |
|---|---|---|
| 2008/0157238 A1 | 7/2008 | Hsiao |
| 2009/0101998 A1 | 4/2009 | Yen et al. |
| 2011/0068484 A1 | 3/2011 | Meyer et al. |
| 2012/0266684 A1 | 10/2012 | Hooper et al. |

FOREIGN PATENT DOCUMENTS

| | | |
|---|---|---|
| GB | 2493246 A | 1/2013 |
| KR | 10-2011-0091158 A | 8/2011 |
| KR | 20110091158 A | 8/2011 |
| WO | 2007117198 A1 | 10/2007 |
| WO | 2009085409 A1 | 7/2009 |
| WO | 2012051340 A1 | 4/2012 |

OTHER PUBLICATIONS

Office Action dated Feb. 19, 2016 for Russian Application No. 2014152357, 12 pages.
Office Action dated Apr. 26, 2016 for Korean Application No. 2014-7036187, 11 pages.
Search Report dated Jun. 14, 2016 for Taiwan Application No. 103120535, 2 pages.
Office Action dated Oct. 28, 2016 for Korean Application No. 2014-7036187, 13 pages.
Non-Final Office Action dated Jul. 21, 2016 for U.S. Appl. No. 14/403,571, 20 pages.
Notice of Allowance dated Feb. 7, 2017 for U.S. Appl. No. 141403,571, 16 pages.
Non-Final Office Action dated Sep. 22, 2017 for U.S. Appl. No. 15/484,765, 13 pages.
Office Action dated Apr. 20, 2018 for German Application No. 112013003153.1, 9 pages.

MICROELECTROMECHANICAL SYSTEM (MEMS) ON APPLICATION SPECIFIC INTEGRATED CIRCUIT (ASIC)

CROSS REFERENCE TO RELATED APPLICATIONS

The present application is a continuation of U.S. application Ser. No. 15/484,765, filed Apr. 11, 2017, entitled "MICROELECTROMECHANICAL SYSTEM (MEMS) ON APPLICATION SPECIFIC INTEGRATED CIRCUIT (ASIC)" which is a divisional of U.S. application Ser. No. 14/403,571, filed Nov. 24, 2014, entitled "MICROELECTROMECHANICAL SYSTEM (MEMS) ON APPLICATION SPECIFIC INTEGRATED CIRCUIT (ASIC)", now U.S. Pat. No. 9,663,353, issued May 30, 2017, which is a national phase entry under 35 U.S.C. § 371 of International Application No. PCT/US2013/048552, filed Jun. 28, 2013, entitled "MICROELECTROMECHANICAL SYSTEM (MEMS) ON APPLICATION SPECIFIC INTEGRATED CIRCUIT (ASIC)", which designated, among the various States, the United States of America. The Specification of the PCT/US2013/048552, U.S. patent application Ser. No. 14/403,571, and U.S. patent application Ser. No. 15/484,765 Applications are hereby incorporated by reference.

FIELD

Embodiments of the present disclosure generally relate to the field of electronic device components, and more particularly, to methods and apparatuses for assembling packages for mobile devices.

BACKGROUND

Microelectromechanical systems (MEMS) are a field of growth in the global semiconductor business. MEMS components and sensors may be used in the fast-growing mobile phone and tablet industry. In many products, a MEMS may be wire-bonded with a separate lid/cap element. The lid/cap element may increase the package size of the MEMS, and require an additional manufacturing step which may increase the overall cost of the package.

DETAILED DESCRIPTION

Figure 1:
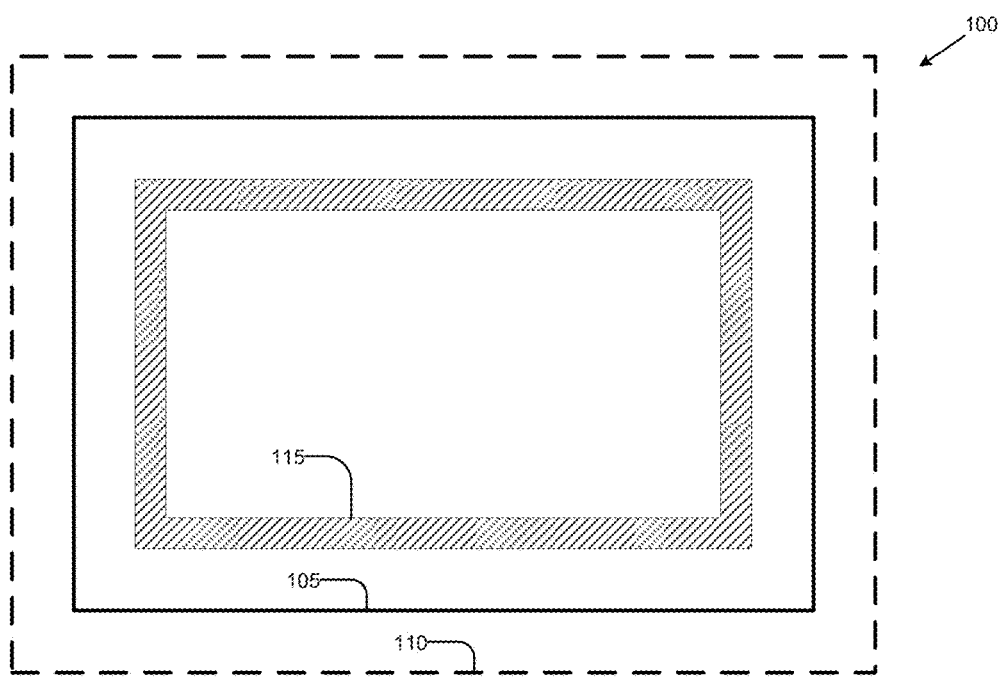
FIG. 1 illustrates a top-down view of a MEMS with an interconnect coupled with an application-specific integrated circuit (ASIC), in accordance with embodiments.

As noted above, in existing packages a MEMS may be coupled with a lid/cap element which in turn may be coupled with an ASIC. The lid/cap element may increase the cost and manufacturing complexity of the package. In embodiments described herein, the MEMS may instead be coupled directly with the ASIC. Specifically, the MEMS may be coupled with, or otherwise include, an interconnect. The interconnect may be coupled directly to the ASIC. The MEMS, interconnect, and ASIC may form a cavity such that the active side of the MEMS is inside of the cavity. In some embodiments, a plurality of MEMS may be coupled with the same ASIC. These embodiments and other embodiments disclosed herein may provide the advantages of having a smaller size as well as reduced cost and a faster manufacturing time.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or elements are in direct contact.

In various embodiments, the phrase "a first feature formed, deposited, or otherwise disposed on a second feature," may mean that the first feature is formed, deposited, or disposed over the feature layer, and at least a part of the first feature may be in direct contact (e.g., direct physical and/or electrical contact) or indirect contact (e.g., having one or more other features between the first feature and the second feature) with at least a part of the second feature.

Various operations may be described as multiple discrete operations in turn, in a manner that is most helpful in understanding the claimed subject matter. However, the order of description should not be construed as to imply that these operations are necessarily order dependent.

As used herein, the term "module" may refer to, be part of, or include an ASIC, an electronic circuit, a processor (shared, dedicated, or group) and/or memory (shared, dedicated, or group) that execute one or more software or firmware programs, a combinational logic circuit, and/or other suitable components that provide the described functionality.

FIG. 1 depicts a top-down view of an example of a package 100 including a MEMS 105 coupled directly with an ASIC 110. The ASIC 110 is illustrated using a dashed line to indicate that the MEMS is transparent in FIG. 1 to avoid obscuring the underlying elements such as the MEMS 105. As shown in FIG. 1, the MEMS 105 may be smaller than the ASIC 110, however in other embodiments the MEMS 105 may be the same size as, or larger than, the ASIC 110. The MEMS 105 may be coupled with or include an interconnect 115. In embodiments, the interconnect 115 may be constructed of an electrically neutral or insulative material such as as a non-conducting paste (NCP), non-conducting film (NCF), insulating die-attach film (DAF), or some other electrically neutral or insulative material. In other embodiments, the interconnect 115 may be constructed of an electrically conductive material such as flip-chip soldering (FC soldering) or any other electrically conductive paste. As shown in FIG. 1, the interconnect 115 may be smaller than one or both of the MEMS 105 or the ASIC 110. However, in other embodiments, the interconnect 115 may be the same size as the MEMS 105 and/or the interconnect 115. In some embodiments, the interconnect 115 may be generally rectangular or square, while in other embodiments the interconnect 115 may have a different shape such as a generally round shape, a triangular shape, or some other shape. In some embodiments, the interconnect 115 may generally be a singular piece of material, while in other embodiments the interconnect 115 may be a plurality of materials, for example multiple elements such as a plurality of solder balls, that are fused together to form a singular shape.

An ASIC, for example ASIC 110, may be an ASIC die. For example, the ASIC 110 may include one or more circuits embedded within and/or upon a substrate such as silicon, gallium arsenide, SiC (silicon carbide) graphene or any organic semiconductor material. In some embodiments, the ASIC 110 may be a general circuit, which may alternatively be referred to as an integrated circuit. In other embodiments, the ASIC 110 may be directed toward a specific application. For example, the circuitry of the ASIC 110 may be specifically configured to perform a given process or function. In some embodiments, the circuitry of the ASIC 110 may be specifically configured such that the function or process of the ASIC 110 corresponds to the type of MEMS, for example MEMS 105, which is to be mounted to the ASIC 110. Although the term ASIC 110 is used in this specification to describe embodiments, in other embodiments the ASIC may refer to a processor, a physical memory, or some other component.

In embodiments, a MEMS, for example MEMS 105 may be a gyroscope to determine an orientation of the MEMS, the package containing the MEMS, or a device incorporating the package. In some embodiments, the MEMS may be an accelerometer to determine motion of the MEMS, the package containing the MEMS, or a device incorporating the package. In some embodiments, the MEMS may be a magnetometer to determine magnetic field at or near the MEMS, the package containing the MEMS, or a device incorporating the package. In some embodiments, the MEMS may be a microphone to identify sound at or near the MEMS, the package containing the MEMS, or a device incorporating the package. In some embodiments, the MEMS may be a filter to filter an electric signal. In some embodiments, the MEMS may be an oscillator to modulate or alter an electric signal. In some embodiments, the MEMS may be a pressure sensor to determine a change in pressure such as atmospheric pressure near the MEMS, the package containing the MEMS, or a device incorporating the package. In some embodiments, the MEMS may be a radio frequency identification (RFID) chip configured to operate in an RFID system. In some embodiments, the MEMS may be a speaker configured to make a noise. In some embodiments, the MEMS may be some other device. In embodiments, the MEMS may refer to a die or an element of a die. In other embodiments, the MEMS may be a component that would not generally be considered or called a die.

As noted with respect to FIG. 1, the MEMS 105 may be coupled to an interconnect 115, while in other embodiments the MEMS 105 may include or otherwise be integrated with the interconnect 115. Alternatively, the ASIC 110 may be coupled to the interconnect 115, while in other embodiments the ASIC 110 may include or otherwise be integrated with the interconnect 115.

Figure 2:
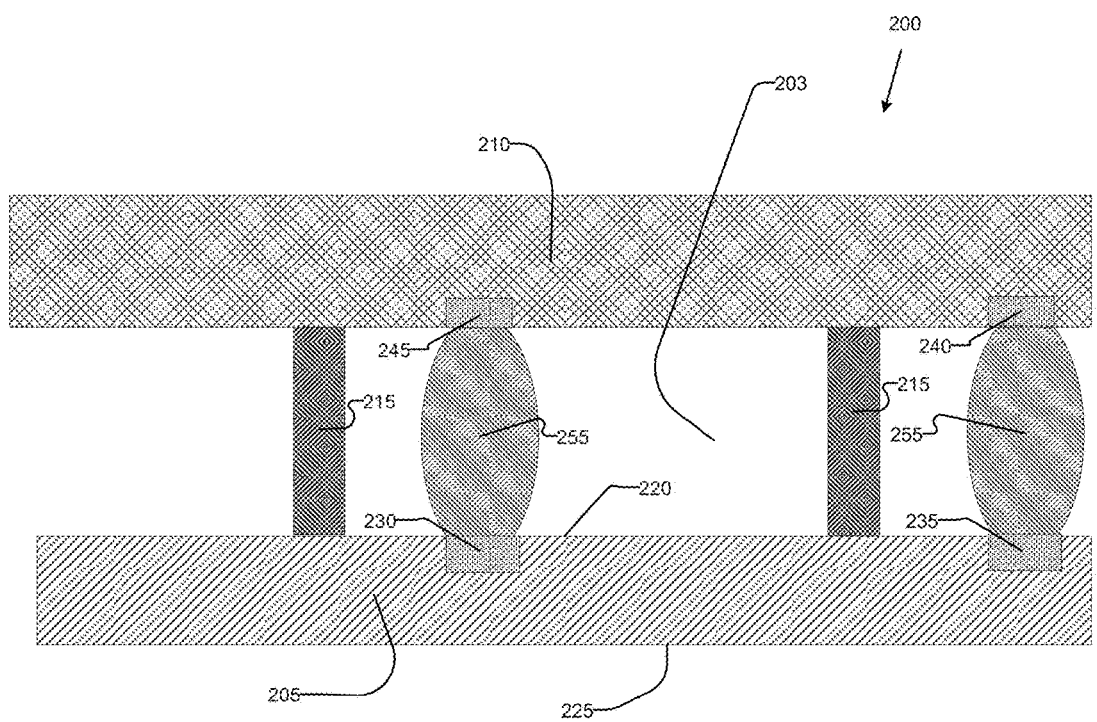
FIG. 2 illustrates an example configuration of an active side of a MEMS communicatively coupled with an ASIC, in accordance with embodiments.

FIG. 2 depicts a cross-section side view of an example of a package 200 including a MEMS 205 coupled directly with an ASIC 210. In embodiments, the MEMS 205 may be similar to the MEMS 105 of FIG. 1, and the ASIC 210 may be similar to the ASIC 110 of FIG. 1. The package 200 may further include an interconnect 215, which may comport with embodiments described in connection with interconnect 115 of FIG. 1 and which may be configured to couple the MEMS 205 to the ASIC 210. In embodiments, the MEMS 205, the interconnect 215, and the ASIC 210 may generally define a cavity 203.

In embodiments, the MEMS 205 may include an active side 220 and an inactive side 225. In embodiments, the active side 220 may be called a "frontside" and the inactive side 225 may be called a "backside" of the MEMS 205. In embodiments, the active side 220 of the MEMS 205 may include processing circuitry (not shown in FIG. 2) and electrically conductive MEMS contacts of the MEMS 205. In some embodiments, the MEMS contacts may be generally within the cavity 203, for example MEMS contacts 230. In other embodiments, the MEMS contacts may be on or within the active side 220 of the MEMS 205 outside of the cavity 203, for example MEMS contacts 235.

In embodiments, the circuitry of the MEMS 205 may be susceptible to physical and or electrical disruption. In embodiments the circuitry of the MEMS 205 may include processing circuitry, sensors, or other sensitive devices disposed on or within the MEMS 205. For example, if the circuitry of the MEMS 205 is in physical contact with another material, for example an overmold or underfill material, then the circuitry of the MEMS 205 may experience interference and not function as desired. Therefore, it may be desirable for the cavity 203 to be a vacuum, be filled with an inert gas, or be an air cavity. In some embodiments, the cavity may not be completely sealed by the MEMS 205 and/or the ASIC 210 and may be configured to, for example, receive sound waves through the MEMS 205 and/or ASIC 210 such that the sound waves may be processed by circuitry on or in the active side 220 of the MEMS 205 such as microphone circuitry. Generally, because the circuitry of the MEMS 205 may be within the cavity 203, then the circuitry may be protected from physical contact with other materials by the combination of the MEMS 205, the interconnect 215, and the ASIC 210.

In embodiments, the circuitry on the active side 220 of the MEMS 205, which is not shown in FIG. 2, may be coupled with one or more of the MEMS contacts 230 or 235 The MEMS contacts 235 may be coupled with ASIC contacts which may be outside of the cavity 203 such as, for example, ASIC contacts 240. Additionally or alternatively, the MEMS contacts 230 may be coupled with ASIC contacts inside of the cavity 203, such as, for example ASIC contacts 245. In embodiments, the MEMS contacts 230 or 235 and the ASIC contacts 240 or 245 may be coupled to one another via one or more die-level interconnects such as a conductive solder ball. For example, a MEMS contact 230 or 235 may be coupled to an ASIC contact 240 or 245 through a die-level interconnect such as a solder ball 255 which may be configured to transfer an electrical signal from the MEMS contact 230 or 235 to an ASIC contact 240 or 245. It will be understood that although the solder ball 255 is depicted as generally round, in other embodiments it may have a different shape. In embodiments, the solder ball 255 may be or include tin, lead, silver, or some alloy of these materials or other similar materials. The MEMS 205 and the ASIC 210 may be coupled using other suitable die-interconnect structures in other embodiments including, for example, bumps, flip-chip style bumps, pillars and the like.

As shown in FIG. 2, the MEMS 205 may be coupled directly with the ASIC 210 by way of the interconnect 215. By coupling the MEMS 205 directly with the ASIC 210 and forming the cavity 203, a number of advantages may be realized. Specifically, the ASIC 210 may take the place of the commonly used lid/cap discussed above, which may be typically used to protect the active side 220 of the MEMS 205. By removing a separate lid/cap from the package 200, the manufacturing process may be simplified which may result in a package that may be easier, faster, and cheaper to manufacture.

Figure 3:
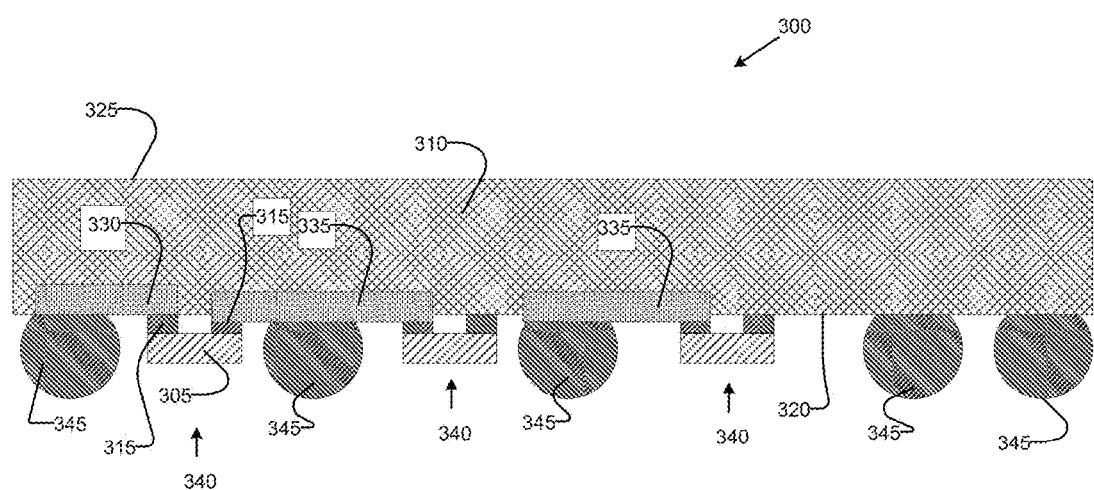
FIGS. 3, 4, 5, 6, 7, 8, and 9 illustrate examples of a multi-MEMS ASIC, in accordance with embodiments.

FIG. 3 depicts a cross-sectional view of an example of a package 300 including a MEMS 305, which may be similar to MEMS 105 in FIG. 1. The package 300 may also include an ASIC 310, which may be similar to ASIC 110 in FIG. 1. The MEMS 305 may be coupled with the ASIC 310 by way of an interconnect 315, which may be similar to interconnect 115 of FIG. 1. In embodiments, the MEMS 305 and/or ASIC 310 may include MEMS contacts 230 or 235, or ASIC contacts 240 or 245, which are not shown in FIG. 3 for clarity. Additionally, the MEMS 305 may be coupled with the ASIC 310 by way of one or more of the die-level interconnects described in FIG. 2, which are not shown in FIG. 3 for clarity.

In embodiments, the ASIC 310 may have an active side 320 and an inactive side 325. Similarly to the MEMS 305, the active side 320 of the ASIC 310 may include circuitry, while the inactive side 325 of the ASIC 310 may not include circuitry. Similarly to the MEMS, the circuitry of the ASIC 310 may include processing circuitry, sensors, and/or other sensitive devices disposed on or within the ASIC 310 In the package 300 of FIG. 300, the MEMS 305 and interconnect 315 may be coupled with the active side 320 of the ASIC 310. In embodiments, the active side may include one or more redistribution layers (RDLs) 330 and 335. In embodiments, the RDL 330 may be generally flush with the active side 320 of the ASIC 310. Additionally or alternatively, the RDL 335 may extend from the active side 320 of the ASIC 310 or be embedded within the ASIC 310. In embodiments, the interconnect 315 may be coupled to the ASIC 310 by way of one or more of the RDLs 330 or 335. In some embodiments, the RDLs 330 or 335 may be electrically conductive and configured to carry an electrical signal. In embodiments, the RDLs 330 or 335 may include or be made of a conductive metal such as gold, copper, silver, or some alloy thereof. In some embodiments (not shown), the RDLs 330 or 335 may be covered by a dielectric or electrically neutral or insulative material such as silicon nitride, silicon oxide, a polyimide, or some combination thereof. The RDLs 330 or 335 may be composed of other suitable electrically conductive or electrically neutral/insulative materials in other embodiments.

As used herein, the MEMS 305 and the interconnect 315 may be called a MEMS structure 340. As shown in FIG. 3, the package 300 may include more than one MEMS structure 340. For example, the package 300 may include three MEMS structures 340, which may be electrically isolated from each other, or at least two of the MEMS structures 340 may be in electrical communication with the ASIC 310. In embodiments, the MEMS structure 340 may be in contact with one or more of the RDLs 330 or 335, or coupled directly with the ASIC 310.

In embodiments, the ASIC 310 may be coupled with one or more package-level interconnects 345. In embodiments, the package-level interconnects 345 may be a solder material such as the solder material discussed with respect to solder ball 255 in FIG. 2. In other embodiments, the package-level interconnects 345 may include wirebond wires which may be may be or include silver, copper, gold, or some other alloy of these materials or other similar materials. The package-level interconnects 345 may include other suitable interconnect structures in other embodiments. As noted above, in some embodiments, the RDLs 330 or 335 may be electrically conductive and configured to carry a signal. In embodiments, the RDLS 330 or 335 may carry the signal from a MEMS structure 340 through the RDL 330 or 335 and to the package-level interconnects 345. The package-level interconnects 345 may also be electrically conductive and configured to carry the signal from the package 300 to a computer board (e.g., circuit board such as a motherboard) or other electrical circuit (e.g., package substrate) to which the package 300 is coupled using the package-level interconnects 345.

Figure 4:
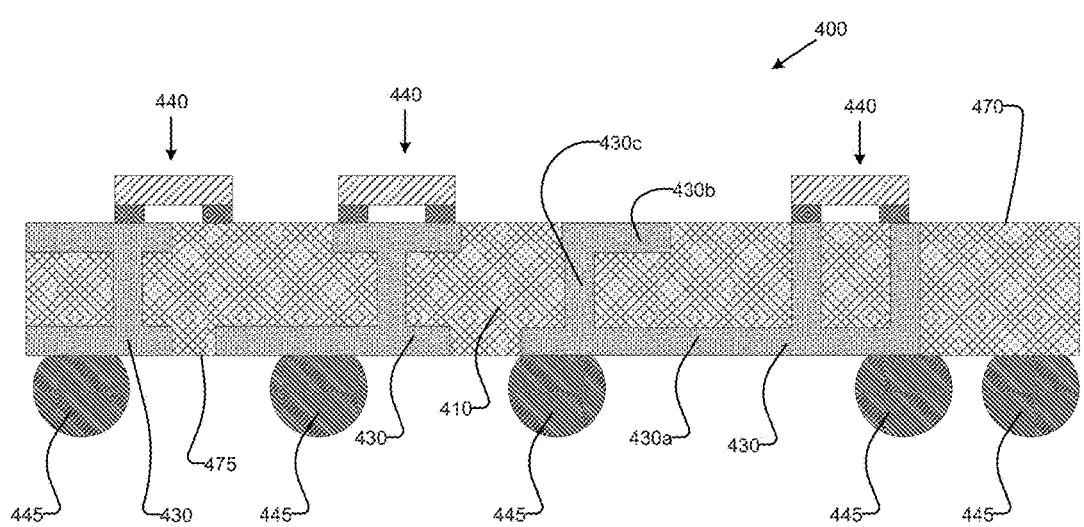

FIG. 4 depicts a cross-sectional view of an alternative embodiment of a package 400 including a MEMS structure 440, which may be similar to MEMS structure 340 in FIG. 3 and include a MEMS and interconnect, which may be similar to MEMS 305 and interconnect 315, respectively. The package 400 may also include an ASIC 410, which may be similar to ASIC 310 in FIG. 3. In embodiments, the MEMS structure 440 and/or ASIC 410 may include MEMS contacts 230 or 235, or ASIC contacts 240 or 245, which are not shown in FIG. 4 for clarity. Additionally, the MEMS of the MEMS structure 440 may be coupled with the ASIC 410 by way of one or more of the die-level interconnects described in FIG. 2, which are not shown in FIG. 4 for clarity.

In embodiments, the ASIC 410 may include one or more RDL/TSVs 430, which are described below in further detail. In embodiments, the MEMS structures 440 may be coupled with a first side 470 of the ASIC 410. In embodiments, one or more package-level interconnects 445 may be coupled with a second side 475 of the ASIC 410 opposite the first side 470. In one embodiment, the first side 470 may be the active side of the ASIC 410, which may be similar to the active side 320 of the ASIC 310 of FIG. 3. In this embodiment, the second side 475 of the ASIC 410 may be the inactive side of the ASIC 410, which may be similar to the inactive side 325 of the ASIC 310 of FIG. 3. In other embodiments, the first side 470 may be the inactive side of the ASIC 410, while the second side 475 may be the active side of the ASIC 410.

In embodiments, the signal may be transmitted from the first side 470 of the ASIC 410 to the second side 475 of the ASIC 410 by way of one or more through silicon vias (TSVs) which are shown as integrated with two RDLs in FIG. 4. Specifically, an RDL/TSV 430 may refer to an integrated structure which includes an RDL 430a on the second side 475 of the ASIC 410, an RDL 430b on the first side 470 of the ASIC 410, and a TSV 430c coupling the two RDLs 430a and 430b to one another. However, for ease of reference herein, the RDLs 430a and 430b, and the TSV 430c, are referred to as a singular RDL/TSV 430. The RDL/TSVs 430 may be electrically conductive and configured to carry a signal from a MEMS of a MEMS structure 440 through the RDL/TSV 430 to a package-level interconnect 445 configured to carry the signal from the package 400 to a computer board or other electrical circuit to which the package 400 is coupled. The ASIC 410 may include more or fewer RDLs than depicted and/or alternative means for routing electrical signals between the first side 470 and the second side 475 such as, for example, trenches or vias that form one or more interconnect layers between the first side 470 and the second side 475.

Figure 5:
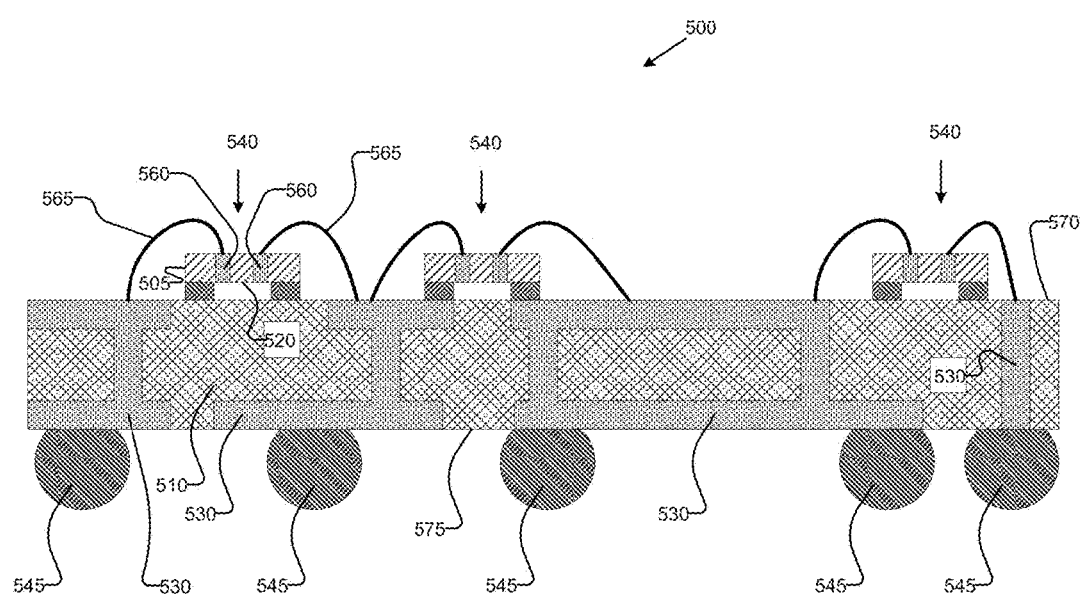

FIG. 5 depicts a cross-sectional view of an alternative embodiment of a package 500 including a MEMS structure 540, which may be similar to MEMS structure 440 in FIG. 4 and include a MEMS 505 and interconnect, which may be similar to MEMS 305 and interconnect 315, respectively. The package 500 may also include an ASIC 510, which may be similar to ASIC 410 in FIG. 4. In embodiments, one or more of the MEMS structures 540 may be coupled with one or more package-level interconnects 545, which may be similar to package-level interconnects 445 of FIG. 4, by way of one or more RDL/TSVs 530, which may be similar to an RDL/TSV 430 of FIG. 4. The ASIC 510 may have a first side 570, which may be similar to the first side 470 of the ASIC 410 of FIG. 4, and a second side 575, which may be similar to the second side 475 of the ASIC 410 of FIG. 4.

In the embodiment shown in FIG. 5, the MEMS 505 of the MEMS structure 540 may not include MEMS contacts 230 or 235. Additionally or alternatively, the ASIC 510 may not include ASIC contacts such as ASIC contacts 240 or 245. In some embodiments, at least some of the MEMS contacts 230 or 235, or ASIC contacts 240 or 245, may be present. Therefore, the MEMS 505 may include one or more TSVs 560 which are configured to carry an electrical signal from the active side 520 of the MEMS 505, through the body of the MEMS 505, to a second side of the MEMS (not labeled in FIG. 5 for clarity). In embodiments, the TSVs 560 may then be coupled with one or more of the RDL/TSVs 530 via wirebonds 565, which may be or include silver, copper, gold, or some other alloy of these materials or other similar materials. In this manner, an electrical signal may be carried from the active side 520 of the MEMS 505, through the TSVs 560, to the wirebonds 565. The signal may then travel through the wirebonds 565 to the RDL/TSVs 530, and from the RDL/TSVs 530 to a circuit board or other electrical circuit via a package-level interconnect 545. In embodiments, the MEMS structure 540 may be coupled with a first side 570 of the ASIC 510 while the package-level interconnects 545 are coupled with the second side 575 of the ASIC 510. In some embodiments, the first side 570 may be an active side of the ASIC 510 while the second side 575 may be an inactive side of the ASIC 510. In other embodiments, the first side 570 may be an inactive side of the ASIC 510 while the second side 575 may be an active side of the ASIC 510.

Figure 6:
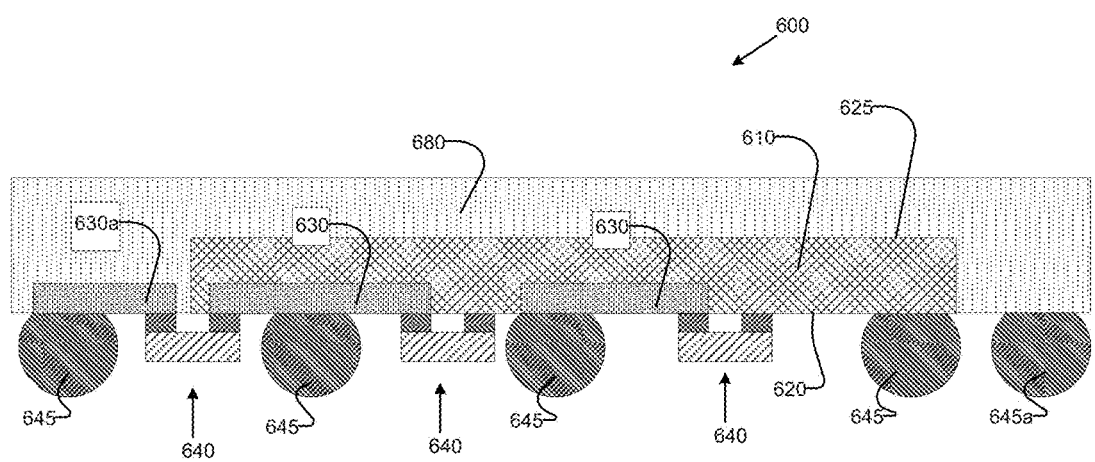

FIG. 6 depicts a cross-sectional view of an alternative embodiment of a package 600 including a MEMS structure 640, which may be similar to MEMS structure 340 in FIG. 3 and include a MEMS and interconnect, which may be similar to MEMS 305 and interconnect 315, respectively. The package 600 may also include an ASIC 610, which may be similar to ASIC 310 in FIG. 3. In embodiments, the MEMS structure 640 and/or ASIC 610 may include MEMS contacts 230 or 235, or ASIC contacts 240 or 245, which are not shown in FIG. 4 for clarity. Additionally, the MEMS of the MEMS structure 640 may be coupled with the ASIC 410 by way of one or more of the die-level interconnects described in FIG. 2, which are not shown in FIG. 6 for clarity. The ASIC 610 may have an active side 620 and an inactive side 625, which may be respectively similar to active side 320 and inactive side 325, respectively.

In embodiments, the ASIC 610 may be at least partially covered by a mold compound 680. In some embodiments, the package 600 may be considered to be an embedded wafer level ball grid array (eWLB) package. In embodiments, the mold compound 680 may be made of or include any epoxy based material including varous reinforcements and fillers. The mold compound 680 may be composed of other suitable materials in other embodiments.

In some embodiments, one or more RDLs such as RDL 630a may be disposed inside of or otherwise coupled to the mold compound 680 rather than the ASIC 610. Other RDLs, for example RDLs 630 may be disposed inside of or otherwise coupled to the ASIC 610, for example as described above with respect to RDLs 330 or 335. The coupling of the RDL 630a to the mold compound 680 may increase the fan-out area of the package 600. The fan-out area may be considered the lateral area occupied by the package 600, and increasing the fan-out area may allow more components to be coupled with the package, provide better structural support, or provide better heat distribution of the package 600. As shown in FIG. 6, at least one of the package-level interconnects 645a may likewise be coupled directly to the mold compound 680, while other package-level interconnects 645 are coupled with an RDL such as RDLs 630a or 630, or directly to the ASIC 610.

Figure 7:
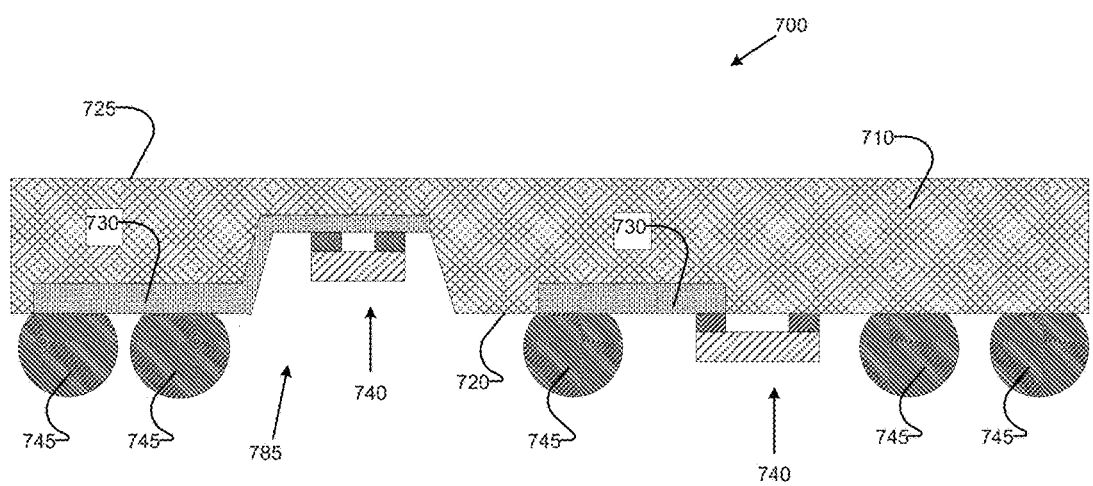

FIG. 7 depicts a cross-sectional view of an alternative embodiment of a package 700 including a MEMS structure 740, which may be similar to MEMS structure 340 in FIG. 3 and include a MEMS and interconnect, which may be similar to MEMS 305 and interconnect 315, respectively. The package 700 may also include an ASIC 710, which may be similar to ASIC 310 in FIG. 3. In embodiments, the MEMS structure 740 and/or ASIC 710 may include MEMS contacts 230 or 235, or ASIC contacts 240 or 245, which are not shown in FIG. 7 for clarity. Additionally, the MEMS of the MEMS structure 740 may be coupled with the ASIC 710 by way of one or more of the die-level interconnects described in FIG. 2, which are not shown in FIG. 7 for clarity. The ASIC 710 may have an active side 720 and an inactive side 725, which may be respectively similar to active side 320 and inactive side 325, respectively. Additionally, the package 700 may include one or more package-level interconnects 745 which may be coupled with an RDL 730 of the package 700 and/or directly to the ASIC 710.

The ASIC 710 may include a cavity 785 in the active side 720 of the ASIC 710. The cavity may be chemically, mechanically, or laser etched, ablated, or otherwise formed in the active side 720 of the ASIC either during the manufacturing of the ASIC 710 or after the ASIC 710 is manufactured. In embodiments, an RDL 730 may extend into the cavity 785, and be coupled with a MEMS structure 740 inside of the cavity 785. In other embodiments, a MEMS structure 740 may be coupled directly with the ASIC 710 inside of the cavity 785. Although the cavity 785 is shown as angular with respect to the ASIC 710, in other embodiments the walls of the cavity 785 may be perpendicular to the active side 720 of the ASIC 710, rounded, or have some other shape or configuration. Additionally, even though a single cavity 785 is shown in FIG. 7, in other embodiments the ASIC 710 may include a plurality of cavities such as cavity 785. In embodiments, one or more cavities such as cavity 785 may provide different advantages. For example, the cavity 785 may reduce the thickness of a package such as package 700. Additionally, disposing a MEMS structure 740 inside of a cavity 785 may provide protection for a particular physically sensitive MEMS, because the cavity may make it more difficult for an outside object to come in contact with the MEMS and/or MEMS structure 740.

Figure 8:
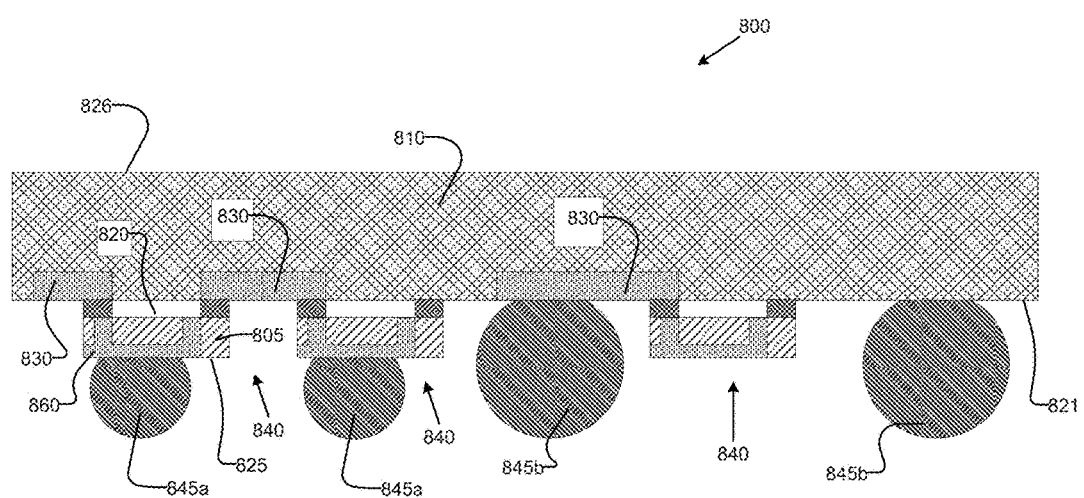

FIG. 8 depicts a cross-sectional view of an alternative embodiment of a package 800 including a MEMS structure 840, which may be similar to MEMS structure 540 in FIG. 5 and include a MEMS 805 and an interconnect, which may be similar to MEMS 505 and interconnect 315, respectively. The package 800 may also include an ASIC 810, which may be similar to ASIC 510 in FIG. 5. In embodiments, the MEMS 805 and/or ASIC 810 may include MEMS contacts 230 or 235, or ASIC contacts 240 or 245, which are not shown in FIG. 8 for clarity. Additionally, the MEMS 805 may be coupled with the ASIC 810 by way of one or more of the die-level interconnects described in FIG. 2, which are not shown in FIG. 8 for clarity. The ASIC 810 may have an active side 821 and an inactive side 826, which may be respectively similar to active side 320 and inactive side 325 of FIG. 3, respectively.

In embodiments, one or more of the MEMS structures 840 may include a MEMS 805 with a TSV 860, which may be similar to the TSVs 560 of FIG. 5. In some embodiments, one or more of the package-level interconnects 845*a*, which may be similar to package-level interconnects 545 of FIG. 5, may be coupled directly with an inactive side 825 of the MEMS 805. In embodiments, a TSV 860 of a MEMS 805 may be configured to carry an electrical signal from the active side 820 of the MEMS 805 through the body of the MEMS 805 and to the one or more package-level interconnects 845*a*. In embodiments, the TSV 860 may be additionally coupled with an interconnect (not labeled for clarity) of the MEMS structure 840. In embodiments, the TSV 860 may be configured to carry an electrical signal between one or more of the RDL 830, through a MEMS contact or the interconnect, and to or from one or more of the package-level interconnects 845*a*.

In some embodiments, other package-level interconnects 845*b*, which may be similar to package-level interconnects 545 of FIG. 5, may be coupled directly with the ASIC 810 or an RDL 830 of the ASIC 810. In some embodiments, the package-level interconnects 845*a* and 845*b* may be different sizes such that the package 800 has a relatively even surface-mount level. In other words, the package-level interconnects 845*a* and 845*b* may be different sizes such that each package-level interconnect 845*a* and 845*b* have a relatively similar lowest point with respect to the package 800, as depicted. In some embodiments, at least two of the package-level interconnects may be the same size as one another, for example the two package-level interconnects 845*a* or the two package-level interconnects 845*b*.

Figure 9:
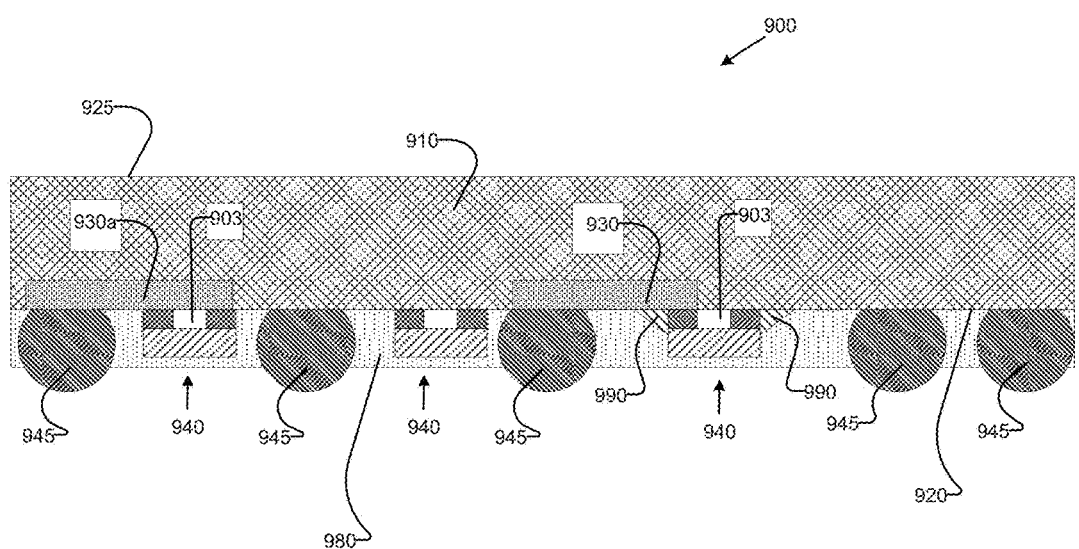

FIG. 9 depicts a cross-sectional view of an alternative embodiment of a package 900 including a MEMS structure 940, which may be similar to MEMS structure 340 in FIG. 3 and include a MEMS and interconnect, which may be similar to MEMS 305 and interconnect 315, respectively. The package 900 may also include an ASIC 910, which may be similar to ASIC 310 in FIG. 3. In embodiments, the MEMS structure 940 and/or ASIC 910 may include MEMS contacts 230 or 235, or ASIC contacts 240 or 245, which are not shown in FIG. 9 for clarity. Additionally, the MEMS of the MEMS structure 940 may be coupled with the ASIC 910 by way of one or more of the die-level interconnects described in FIG. 2, which are not shown in FIG. 9 for clarity. The ASIC 910 may have an active side 920 and an inactive side 925, which may be respectively similar to active side 320 and inactive side 325, respectively. Additionally, the package 900 may include one or more package-level interconnects 945 which may be coupled with an RDL 930 or 930*a* of the package 900 and/or directly to the ASIC 910. The one or more package-level interconnects 945 may be similar to package-level interconnects 345.

In embodiments, one or more of the MEMS structures 940 may be at least partially surrounded by or otherwise coupled with an underfill material 990. In embodiments, the underfill material 990 may be composed of any epoxy based material with or without filler. As described above, it may be desirable for the cavity 903 of the MEMS structure 940 to be generally sealed such that other materials can not intrude into the cavity 903 and contact the active surface of the MEMS. The underfill material 990 may be disposed on the package 900 and at least partially surround or cover the MEMS structure 940 to hermetically seal or otherwise protect the MEMS structure 940. In other words, the underfill material 990 may act as another barrier against an undesirable material entering the cavity 903 of the MEMS structure 940. Although only a single MEMS structure 940 is shown coupled with an underfill material 990, in other embodiments each MEMS structure 940, or at least more than one MEMS structure 940 on the package 900, may be coupled with or otherwise at least partially surrounded by the underfill material 990.

In some embodiments an RDL such as RDL 930*a* may span across an entire MEMS structure 940 to generally fully cover the cavity 903 of the MEMS structure 940. In embodiments, this RDL 930*a* may serve a purpose similar to that of the underfill material 990 in that it may assist in hermetically sealing the cavity 903 so that undesirable materials can not enter into the cavity 903.

In some embodiments, the active side 920 of the ASIC 910 may be covered by an overmold or frontside mold material 980, which may be similar to the mold compound 680 of FIG. 6. In embodiments, the underfill material 990 and/or extended RDL 930*a* may prevent the overmold material 980 from entering into the cavity 903 of the MEMS structure 940. In other embodiments, the overmold material 980 may serve a similar purpose as described with underfill material 990 in that it may assist in hermetically sealing the cavity 903 so that undesirable materials can not enter into the cavity 903

The above described example embodiments are intended to be examples, and are not intended to be limiting or exclusive of other embodiments. Features of some embodiments may be combined or missing from other embodiments. For example, in some embodiments the package 900 of FIG. 9 may not include the overmold material 980. In other embodiments, the package 900 may not include the RDL 930*a* spanning an entire MEMS structure 940. Some embodiments may include a combination of features. For example, a package such as package 900 may include the MEMS TSVs 560 and wirebonds 565 of FIG. 5. In embodiments where certain elements, for example the MEMS structures 740 or the cavity 785 are described as being on an active side of the ASIC such as ASIC 710, in other embodiments the MEMS structures 740 and/or cavity 785 may be additionally or alternatively located on the inactive side 725 of the ASIC 710, and coupled to the package-level interconnects 745 by way of RDL/TSVs such as RDL/TSV 430. Other combinations of features, or exclusions of features, may be realized in other embodiments.

In some embodiments, different types of MEMS may be coupled with the same ASIC. For example, with reference to FIG. 3, MEMS 305 may be an accelerometer. In addition, one of the MEMS in another MEMS structure 340 may be a gyroscope while a MEMS in a third MEMS structure 340 may be a magnetometer. In other embodiments, at least two of the same type of MEMS may be coupled to an ASIC such as ASIC 310. For example, an ASIC 310 may be coupled with two speaker-type MEMS and a single microphone-type MEMS. In other embodiments, different suitable combinations of MEMS may combined so that different MEMS with different functions may be coupled to the same ASIC such as ASIC 310.

Figure 10:
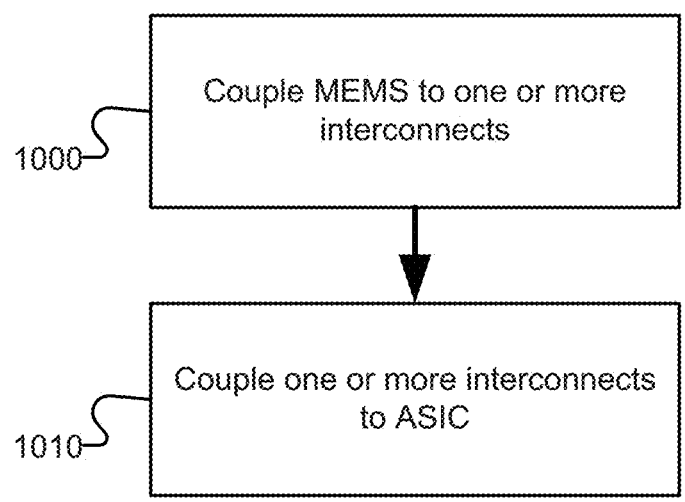
FIG. 10 illustrates a flowchart for manufacturing a package with a MEMS, in accordance with embodiments.

FIG. 10 depicts an example of a manufacturing process for constructing a package such as packages 100, 200, 300, 400, 500, 600, 700, 800, or 900. In embodiments, a MEMS may be coupled to one or more interconnects at 1000. The MEMS may be a MEMS such as MEMS 105, 205, 305, 505, or 805. The one or more interconnects may be one or more interconnects such as interconnect 115, 215, or 315. In some embodiments, as noted above, the MEMS may be coupled to the interconnect during manufacturing of the MEMS. In other embodiments, the MEMS may be coupled to the interconnect after the MEMS is manufactured.

The one or more interconnects may be coupled to an ASIC such as ASIC 110, 210, 310, 410, 510, 610, 710, 810, or 910 at 1010. In embodiments, the one or more interconnects may be an element of the ASIC, which is coupled to the ASIC either during manufacture of the ASIC or after the ASIC is manufactured. In some embodiments, the one or more interconnects may be coupled to the ASIC 110 prior to coupling the MEMS to the one or more interconnects at 1000. The example manufacturing process may not be order dependent in embodiments.

In some embodiments, the one or more interconnects may be coupled to one or both of the MEMS or ASIC via processes such as solderreflow, thermocompression bonding, or lamination.

Figure 11:
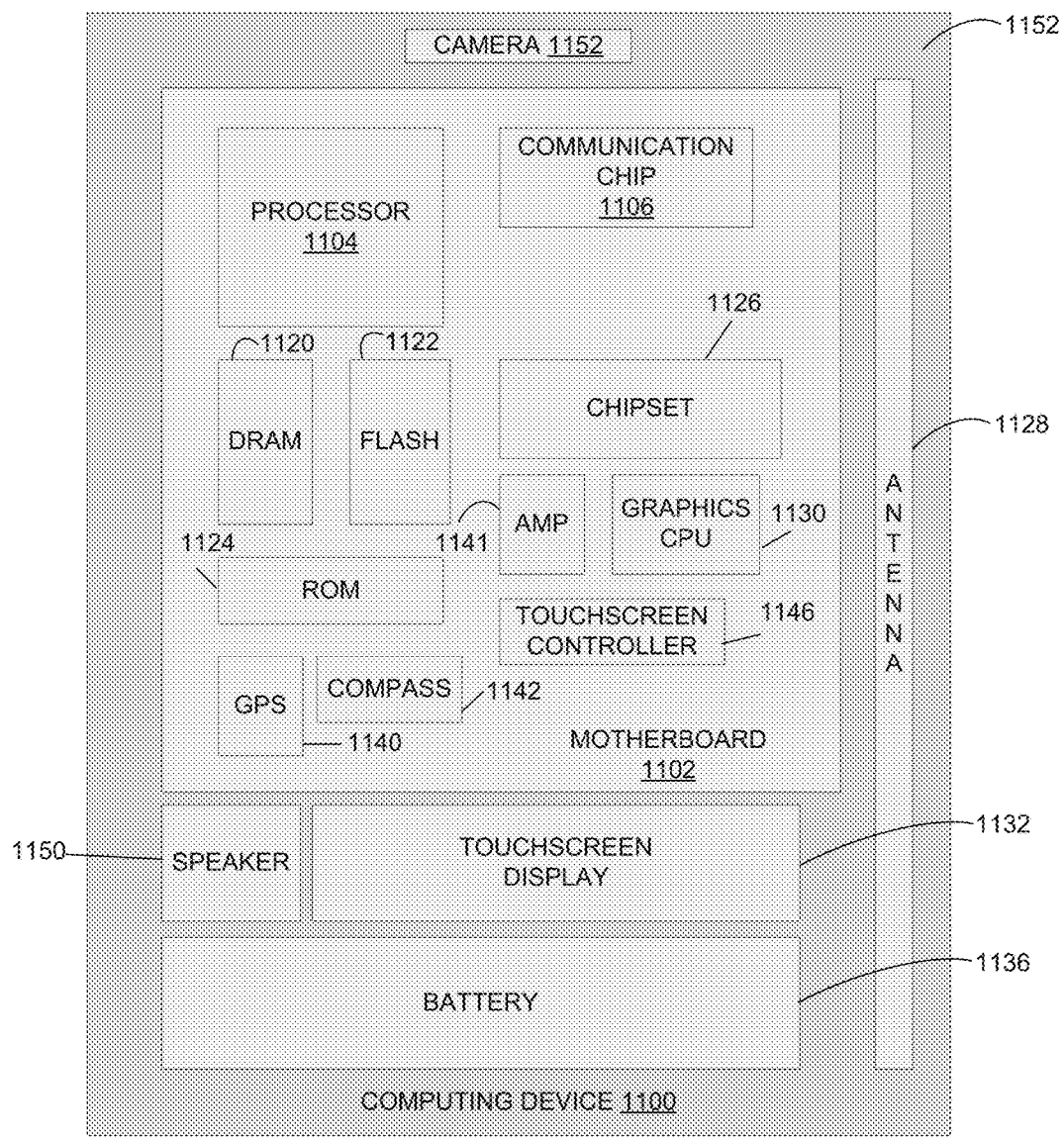
FIG. 11 schematically illustrates a computing device, in accordance with embodiments

Embodiments of the present disclosure may be implemented into a system using any suitable hardware and/or software to configure as desired. FIG. 11 schematically illustrates a computing device 1100 in accordance with one implementation of the invention. The computing device 1100 may house a board such as motherboard 1102 (e.g., housing 1152). The motherboard 1102 may include a number of components, including but not limited to a processor 1104 and at least one communication chip 1106. The processor 1104 may be physically and electrically coupled to the motherboard 1102. In some implementations, the at least one communication chip 1106 may also be physically and electrically coupled to the motherboard 1102. In further implementations, the communication chip 1106 may be part of the processor 1104.

Depending on its applications, computing device 1100 may include other components that may or may not be physically and electrically coupled to the motherboard 1102. These other components may include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Further components, not shown in FIG. 11, may include a microphone, a filter, an oscillator, a pressure sensor, or an RFID chip. In embodiments, one or more of the components may be a MEMS such as MEMS 105, 205, 305, 505, or 805, or a MEMS structure such as MEMS structures 340, 440, 540, 640, 740, 840, or 940. In some embodiments one or more of the components may be a general term for a package such as packages 100, 200, 300, 400, 500, 600, 700, 800, or 900 that contain one or more of the components.

The communication chip 1106 may enable wireless communications for the transfer of data to and from the computing device 1100. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1106 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible BWA networks are generally referred to as WiMAX networks, an acronym that stands for Worldwide Interoperability for Microwave Access, which is a certification mark for products that pass conformity and interoperability tests for the IEEE 802.16 standards. The communication chip 1106 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1106 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1106 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 1106 may operate in accordance with other wireless protocols in other embodiments.

The computing device 1100 may include a plurality of communication chips 1106. For instance, a first communication chip 1100 may be dedicated to shorter range wireless communications such as Wi-Fi and Bluetooth and a second communication chip 1106 may be dedicated to longer range wireless communications such as GPS, EDGE, GPRS, CDMA, WiMAX, LTE, Ev-DO, and others.

The processor 1104 of the computing device 1100 may include a semiconductor die in an IC package assembly. The term "processor" may refer to any device or portion of a device that processes electronic data from registers and/or memory to transform that electronic data into other electronic data that may be stored in registers and/or memory.

The communication chip 1106 may also include a die in an IC package assembly. In further implementations, another component (e.g., memory device or other integrated circuit device) housed within the computing device 1100 may contain a die in an IC package assembly.

In various implementations, the computing device 1100 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1100 may be any other electronic device that processes data, for example an all-in-one device such as an all-in-one fax or printing device.

EXAMPLES

Example 1 may include a package assembly comprising: an application-specific integrated circuit (ASIC) having an active side and an inactive side opposite the active side; a microelectromechanical system (MEMS) having an active side and an inactive side; and one or more interconnects; wherein the MEMS is coupled directly to the ASIC through the one or more interconnects; and wherein the MEMS, the ASIC, and the one or more interconnects form a cavity between the MEMS, the ASIC, and the one or more interconnects.

Example 2 may include the package assembly of example 1, wherein the MEMS is a first MEMS, the cavity is a first cavity, and the one or more interconnects are first one or more interconnects, the package assembly further comprising: a second MEMS; and a second one or more interconnects; wherein the second MEMS is coupled directly to the ASIC through the second one or more interconnects, wherein the second MEMS, the ASIC, and the second one or more interconnects form a second cavity between the second MEMS, the ASIC, and the second one or more interconnects.

Example 3 may include the package assembly of example 2, wherein the first MEMS is a gyroscope, an accelerometer, a magnetometer, a microphone, a filter, an oscillator, a pressure sensor, a radio frequency identification (RFID) chip, or a speaker.

Example 4 may include the package assembly of example 2, further comprising one or more package-level interconnects coupled with the ASIC.

Example 5 may include the package assembly of example 4, wherein an individual package-level interconnect of the one or more package-level interconnects is coupled with the inactive side of the first MEMS; and wherein the individual package-level interconnect is coupled with the ASIC through a through silicon via (TSV) from the inactive side of the MEMS to the active side of the MEMS, wherein the TSV is coupled with the ASIC.

Example 6 may include the package assembly of example 2, wherein an interconnect of the first one or more interconnects is coupled with a redistribution layer (RDL) of the ASIC.

Example 7 may include the package assembly of example 6, wherein the first one or more interconnects and the ASIC are coupled with an underfill; wherein the underfill is configured to hermetically seal the first cavity; and wherein the first cavity is substantially free of the underfill.

Example 8 may include the package assembly of example 7, wherein the RDL is coupled with each of the first one or more interconnects and the underfill, the RDL configured to further hermetically seal the first cavity.

Example 9 may include the package assembly of example 7, further comprising a mold compound encapsulating at least the inactive side of the first MEMS, the underfill, and at least a portion of the ASIC, wherein the cavity is substantially free of the mold compound.

Example 10 may include the package assembly of any of examples 2-6, further comprising a mold compound covering at least a portion of one of the active side or inactive side of the ASIC, wherein the first MEMS is coupled with the other one of the active side or the inactive side of the ASIC.

Example 11 may include the package assembly of any of examples 2-6, wherein the ASIC comprises a third cavity disposed in the active side or the inactive side of the ASIC; and wherein the first MEMS is coupled with the ASIC within the third cavity.

Example 12 may include the package assembly of any of examples 2-4, wherein the first MEMS is coupled to one of the active side or the inactive side of the ASIC through the first one or more interconnects; and wherein the first MEMS is electrically coupled to the other one of the active side or the inactive side of the ASIC through one or more through silicon vias (TSVs) in the ASIC, wherein the one or more TSVs are configured to provide an electrical pathway from the one of the active side or the inactive side of the ASIC to the other one of the active side or the inactive side of the ASIC.

Example 13 may include the package assembly of example 12, wherein the first MEMS is electrically coupled to one or more of the TSVs via one or more wirebonds.

Example 14 may include a method of manufacturing a package assembly, the method comprising: coupling a microelectromechanical system (MEMS) having an active side and an inactive side to one or more interconnects; and coupling the one or more interconnects directly to an application-specific integrated circuit (ASIC) having an active side and an inactive side opposite the active side; wherein the MEMS, the ASIC, and the one or more interconnects define a cavity between the MEMS, the ASIC, and the one or more interconnects.

Example 15 may include the method of example 14, wherein the MEMS is a first MEMS, the cavity is a first cavity, and the one or more interconnects are first one or more interconnects, and further comprising: coupling a second MEMS to a second one or more interconnects; and coupling the second one or more interconnects directly to the ASIC; wherein the ASIC, the second MEMS, and the second one or more interconnects define a second cavity.

Example 16 may include the method of example 15, wherein coupling the first interconnect to the ASIC comprises coupling the first interconnect to a redistribution layer (RDL) of the ASIC.

Example 17 may include the method of examples 15 or 16, further comprising covering at least a portion of one of the active or inactive side of the ASIC with a mold compound, wherein the first cavity is substantially free of the mold compound.

Example 18 may include the method of examples 15 or 16, further comprising: forming a third cavity in the ASIC; and coupling the first MEMS with the ASIC within the third cavity.

Example 19 may include the method of examples 15 or 16, further comprising coupling the first MEMS with the ASIC via a wirebond.

Example 20 may include the method of examples 15 or 16, further comprising coupling the ASIC with a circuit board through a package-level interconnect.

Example 21 may include the method of example 20, further comprising coupling the package-level interconnect with the inactive side of the first MEMS; and coupling the package-level interconnect with the ASIC through a through silicon via (TSV) from the inactive side of the MEMS to the active side of the MEMS, wherein the TSV is coupled with the ASIC.

Example 22 may include the method of examples 15 or 16, further comprising: coupling the first MEMS to one of the active side or the inactive side of the ASIC through the first one or more interconnects; and electrically coupling the first MEMS to the other one of the active side or the inactive side of the ASIC through one or more through silicon vias (TSVs) in the ASIC, wherein the one or more TSVs are configured to provide an electrical pathway from the one of the active side or the inactive side of the ASIC to the other one of the active side or the inactive side of the ASIC.

Example 23 may include a system with a reduced size package assembly, the system comprising: a circuit board; a package assembly coupled with the circuit board, the package assembly comprising: an application-specific integrated circuit (ASIC) having an active side and an inactive side opposite the active side; a microelectromechanical system (MEMS) having an active side and an inactive side; and one or more interconnects; wherein the MEMS is coupled directly to the ASIC through the one or more interconnects; and wherein the MEMS, the ASIC, and the one or more interconnects form a cavity between the MEMS, the ASIC, and the one or more interconnects.

Example 24 may include the system of example 23, wherein the MEMS is a first MEMS, the cavity is a first cavity, and the one or more interconnects are first one or more interconnects, the package assembly further comprising: a second MEMS; and a second one or more interconnects; wherein the second MEMS is coupled directly to the ASIC through the second one or more interconnects, wherein the second MEMS, the ASIC, and the second one or more interconnects form a second cavity between the second MEMS, the ASIC, and the second one or more interconnects.

Example 25 may include the package assembly of example 24, wherein the first MEMS is a gyroscope, an accelerometer, a magnetometer, a microphone, a filter, an oscillator, a pressure sensor, a radio frequency identification (RFID) chip, or a speaker.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

What is claimed is:

1. A package assembly comprising:
an application-specific integrated circuit (ASIC) with a first face and a second face opposite the first face; and
a microelectromechanical system (MEMS) with a first face and a second face opposite the first face;
wherein the MEMS, the ASIC, and one or more interconnects form a cavity between the MEMS, the ASIC, and the one or more interconnects such that the first face of the MEMS is exposed within the cavity.

2. The package assembly of claim 1, further comprising one or more package-level interconnects coupled with the first face of the ASIC.

3. The package assembly of claim 2, further comprising one or more die-level interconnects electrically coupled with the second face of the ASIC and the first face of the MEMS.

4. The package assembly of claim 3, wherein the one or more die-level interconnects are positioned external to the cavity.

5. The package assembly of claim 3, wherein the one or more die-level interconnects are positioned within the cavity.

6. The package assembly of claim 3, wherein one of the one or more package-level interconnects is communicatively coupled with one of the one or more die-level interconnects by a through-silicon via (TSV).

7. The package assembly of claim 6, wherein the one die-level interconnect is directly physically coupled with the TSV.

8. The package assembly of claim 1, wherein the MEMS has a smaller lateral area than a lateral area of the ASIC.

9. The package assembly of claim 1, wherein the MEMS is a gyroscope, an accelerometer, a magnetometer, a microphone, a filter, an oscillator, a pressure sensor, a radio frequency identification (RFID) chip, or a speaker.

10. The package assembly of claim 1, wherein the first face is an active side of the MEMS and the second face is an inactive side of the MEMS.

11. The package assembly of claim 1, wherein the MEMS is a first MEMS and further comprising a second MEMS coupled with the ASIC.

12. The package assembly of claim 1, wherein the one or more interconnects comprise a non-conducting material.

13. The package assembly of claim 1, wherein the one or more interconnects comprise a conductive material.

14. The package assembly of claim 1, wherein the one or more interconnects are one interconnect.

15. The package assembly of claim 1, wherein the one or more interconnects are two or more interconnects.

16. The package assembly of claim 1, wherein the cavity is exposed to external atmosphere.

17. A package assembly comprising:
an application-specific integrated circuit (ASIC) with a first face and a second face opposite the first face;
a microelectromechanical system (MEMS) with an active side and an inactive side opposite the active side, the active side of the MEMS coupled with the second face of the ASIC by one or more interconnects and one or more die-level interconnects; and
one or more package-level interconnects coupled with the first face of the ASIC, the one or more package-level interconnects communicatively coupled with the one or more die-level interconnects by one or more through-silicon vias (TSVs);

wherein the MEMS, the ASIC, and one or more interconnects form a cavity between the MEMS, the ASIC, and the one or more interconnects such that the active side of the MEMS is exposed within the cavity and the one or more die-level interconnects are positioned external to the cavity.

18. The package assembly of claim 17, wherein the MEMS is a first MEMS and further comprising a second MEMS coupled with the ASIC.

19. The package assembly of claim 17, wherein the one or more interconnects comprise a non-conducting material.

20. The package assembly of claim 17, wherein the one or more die-level interconnects are directly physically coupled with one or more TSVs.

21. The package assembly of claim 17, wherein the MEMS has a smaller lateral area than a lateral area of the ASIC.

22. The package assembly of claim 17, wherein the MEMS is a gyroscope, an accelerometer, a magnetometer, a microphone, a filter, an oscillator, a pressure sensor, a radio frequency identification (RFID) chip, or a speaker.

23. The package assembly of claim 17, wherein the active side of the MEMS is coupled directly with the second face of the ASIC by the one or more interconnects and the one or more die-level interconnects.

24. A package assembly comprising:
an application-specific integrated circuit (ASIC); and
a microelectromechanical system (MEMS) with an active face;
wherein the MEMS, the ASIC, and one or more interconnects form a cavity between the MEMS, the ASIC, and the one or more interconnects such that the active face of the MEMS is exposed within the cavity.

25. The package assembly of claim 24, further comprising one or more package-level interconnects coupled with the ASIC on a side of the ASIC opposite the cavity.

26. The package assembly of claim 24, wherein the MEMS is a first MEMS and further comprising a second MEMS coupled with the ASIC.

27. The package assembly of claim 24, wherein the one or more interconnects comprise a non-conducting material.

28. The package assembly of claim 24, wherein the one or more interconnects comprise a conductive material.

29. The package assembly of claim 24, wherein the cavity is exposed to external atmosphere.

* * * * *